United States Patent
Wang et al.

(10) Patent No.: US 11,309,427 B2
(45) Date of Patent: Apr. 19, 2022

(54) THIN FILM TRANSISTOR AND METHOD FOR MANUFACTURING A THIN FILM TRANSISTOR

(71) Applicant: BOE TECHNOLOGY GROUP CO., LTD., Beijing (CN)

(72) Inventors: Zhi Wang, Beijing (CN); Guangcai Yuan, Beijing (CN); Feng Guan, Beijing (CN); Chen Xu, Beijing (CN); Xueyong Wang, Beijing (CN); Jianhua Du, Beijing (CN); Chao Li, Beijing (CN); Lei Chen, Beijing (CN)

(73) Assignee: BOE TECHNOLOGY GROUP CO., LTD., Bejing (CN)

( * ) Notice: Subject to any disclaimer, the term of this patent is extended or adjusted under 35 U.S.C. 154(b) by 72 days.

(21) Appl. No.: 16/642,638

(22) PCT Filed: Mar. 4, 2019

(86) PCT No.: PCT/CN2019/076870
§ 371 (c)(1),
(2) Date: Feb. 27, 2020

(87) PCT Pub. No.: WO2020/177056
PCT Pub. Date: Sep. 10, 2020

(65) Prior Publication Data
US 2021/0151605 A1 May 20, 2021

(51) Int. Cl.
*H01L 29/78* (2006.01)
*H01L 29/786* (2006.01)
*H01L 29/66* (2006.01)

(52) U.S. Cl.
CPC .... *H01L 29/78672* (2013.01); *H01L 29/6675* (2013.01); *H01L 29/78663* (2013.01)

(58) Field of Classification Search
CPC ........... H01L 29/78672; H01L 29/6675; H01L 29/78663; H01L 29/66742; H01L 29/786; H01L 29/1033
(Continued)

(56) References Cited

U.S. PATENT DOCUMENTS

| | | | | |
|---|---|---|---|---|
| 5,980,763 | A * | 11/1999 | Young | H01L 21/02532 216/23 |
| 8,389,417 | B2 * | 3/2013 | Yamazaki | H01L 27/1207 438/722 |

(Continued)

FOREIGN PATENT DOCUMENTS

| | | |
|---|---|---|
| CN | 1725510 A | 1/2006 |
| CN | 105789327 A | 7/2016 |

(Continued)

OTHER PUBLICATIONS

PCT International Search Report, Application No. PCT/CN2019/076870, dated Oct. 25, 2019, 7 pages: with English translation.

(Continued)

*Primary Examiner* — Sheikh Maruf
(74) *Attorney, Agent, or Firm* — Armstrong Teasdale LLP

(57) ABSTRACT

The present disclosure relates to a thin film transistor and a manufacturing method thereof. The thin film transistor includes a substrate, a first semiconductor layer, a gate dielectric layer, and a gate electrode sequentially stacked on the substrate, the first semiconductor layer has a first portion located in a channel region of the thin film transistor and a second portion in source/drain regions of the thin film transistor and located on both sides of the first portion, the second portion and first sub-portions of the first portion adjacent to the second portion include an amorphous semiconductor material, a second sub-portion of the first portion between the first sub-portions includes a polycrystalline semiconductor material, and a second semiconductor layer (Continued)

located in the source/drain regions and in contact with the second portion, wherein a conductivity of the second semiconductor layer is higher than a conductivity of the amorphous semiconductor material.

12 Claims, 3 Drawing Sheets

(58) Field of Classification Search
USPC .......................................... 438/197; 257/288
See application file for complete search history.

(56) References Cited

U.S. PATENT DOCUMENTS

| | | | | |
|---|---|---|---|---|
| 9,887,087 | B1* | 2/2018 | Fuller | H01L 29/7802 |
| 2003/0113957 | A1* | 6/2003 | So | H01L 29/78696 |
| | | | | 438/149 |
| 2005/0139923 | A1* | 6/2005 | Kwon | H01L 27/1296 |
| | | | | 257/347 |
| 2007/0284580 | A1* | 12/2007 | Lim | H01L 29/78609 |
| | | | | 257/66 |
| 2012/0138922 | A1* | 6/2012 | Yamazaki | H01L 29/1033 |
| | | | | 257/43 |
| 2012/0161121 | A1* | 6/2012 | Yamazaki | H01L 21/477 |
| | | | | 257/43 |
| 2012/0220140 | A1* | 8/2012 | Kajiyama | H01L 21/02595 |
| | | | | 438/795 |
| 2012/0313152 | A1* | 12/2012 | Yokoi | H01L 29/66742 |
| | | | | 257/288 |
| 2012/0319183 | A1* | 12/2012 | Yamazaki | H01L 29/7782 |
| | | | | 257/288 |
| 2013/0009219 | A1* | 1/2013 | Yamazaki | H01L 29/24 |
| | | | | 257/288 |
| 2013/0285149 | A1* | 10/2013 | Fonash | H01L 29/0665 |
| | | | | 257/368 |
| 2014/0346500 | A1* | 11/2014 | Yamazaki | H01L 21/02565 |
| | | | | 257/43 |
| 2014/0370670 | A1* | 12/2014 | Isobe | H01L 21/02565 |
| | | | | 438/197 |
| 2015/0021593 | A1* | 1/2015 | Yamazaki | H01L 29/7869 |
| | | | | 257/43 |
| 2016/0293770 | A1* | 10/2016 | Peng | H01L 21/26513 |
| 2019/0088788 | A1* | 3/2019 | Ban | H01L 29/42384 |
| 2019/0198594 | A1* | 6/2019 | Lee | H01L 29/78666 |

FOREIGN PATENT DOCUMENTS

| | | |
|---|---|---|
| CN | 107482066 A | 12/2017 |
| CN | 107863355 A | 3/2018 |

OTHER PUBLICATIONS

PCT Written Opinion, Application No. PCT/CN2019/076870, dated Oct. 25, 2019, 6 pages.: with English translation of relevant part.
China First Office Action, Application No. 201980000226.2, dated Dec. 2, 2020, 14 pps.: with English translation.

* cited by examiner

THIN FILM TRANSISTOR AND METHOD FOR MANUFACTURING A THIN FILM TRANSISTOR

CROSS REFERENCE TO RELATED APPLICATIONS

This patent application is a National Stage Entry of PCT/CN2019/076870 filed on Mar. 4, 2019, the disclosure of which is incorporated by reference herein in its entirety as part of the present application.

BACKGROUND

The present disclosure relates to the field of display technology. Specifically, it relates to a thin film transistor and a method for manufacturing a thin film transistor.

Thin film transistors are widely used in the field of display technology. A thin film transistor can drive a pixel of a display device. A display device provided with a thin film transistor may have advantages such as high speed, high brightness, and high contrast.

BRIEF DESCRIPTION

Embodiments of the present disclosure provide a thin film transistor. The thin film transistor includes a substrate, a first semiconductor layer, a gate dielectric layer, and a gate electrode sequentially stacked on the substrate, wherein the first semiconductor layer has a first portion located in a channel region of the thin film transistor and a second portion in source/drain regions of the thin film transistor and located on both sides of the first portion, and wherein the second portion and first sub-portions, adjacent to the second portion, of the first portion include an amorphous semiconductor material, a second sub-portion, between the first sub-portions, of the first portion includes a polycrystalline semiconductor material, and a second semiconductor layer located in the source/drain regions and in contact with the second portion, wherein a conductivity of the second semiconductor layer is higher than a conductivity of the amorphous semiconductor material.

In some embodiments, the second semiconductor layer is in contact with a surface of the second portion facing the substrate.

In some embodiments, the second semiconductor layer is in contact with a surface of the second portion away from the substrate.

In some embodiments, a doping type of the first semiconductor layer and a doping type of the second semiconductor layer are an N-type, and an N-type carrier concentration of the second semiconductor layer is greater than an N-type carrier concentration of the first semiconductor layer.

In some embodiments, a doping type of the first semiconductor layer and a doping type of the second semiconductor layer are a P-type, and a P-type carrier concentration of the second semiconductor layer is greater than a P-type carrier concentration of the first semiconductor layer.

In some embodiments, a doping concentration of the first semiconductor layer is between $10^{17}$ ions/cm$^3$ and $10^{19}$ ions/cm$^3$, and a doping concentration of the second semiconductor layer is between $10^{19}$ ions/cm$^3$ and $10^{21}$ ions/cm$^3$.

In some embodiments, the polycrystalline semiconductor material includes polysilicon, and the amorphous semiconductor material includes amorphous silicon.

In some embodiments, the thin film transistor further includes a source/drain electrode on a side of the second semiconductor layer facing away from the second portion.

Some embodiments of the present disclosure also provide a method for manufacturing a thin film transistor. The method for manufacturing the thin film transistor includes forming a first semiconductor layer, a gate dielectric layer, and a gate electrode sequentially on a substrate, wherein the first semiconductor layer has a first portion located in a channel region of the thin film transistor and a second portion located in source/drain regions of the thin film transistor and on both sides of the first portion, and wherein the second portion and a first sub-portion of the first portion adjacent to the second portion include an amorphous semiconductor material, and a second sub-portion of the first portion between the first sub-portions includes a polycrystalline semiconductor material, and forming a second semiconductor layer in the source/drain regions and in contact with the second portion, wherein a conductivity of the second semiconductor layer is higher than a conductivity of the amorphous semiconductor material.

In some embodiments, forming the first semiconductor layer includes forming a first semiconductor material layer including the amorphous semiconductor material, the first semiconductor material layer including a middle portion as the first portion and edge portions as the second portion, the edge portions being on both sides of the middle portion, and converting a portion, corresponding to the first sub-portion, of the middle portion of the first semiconductor material layer into the polycrystalline semiconductor material.

In some embodiments, the converting includes laser annealing the amorphous semiconductor material.

In some embodiments, the laser annealing includes using a micro lens array mask.

In some embodiments, the method for manufacturing the thin film transistor further includes forming a source/drain electrode on a side of the second semiconductor layer facing away from the second portions.

In some embodiments, forming the first semiconductor layer, the second semiconductor layer, and the source/drain electrode includes forming a source/drain electrode on the substrate, forming the second semiconductor layer on the source/drain electrode, and forming the first semiconductor layer on the second semiconductor layer.

In some embodiments, forming the first semiconductor layer, the second semiconductor layer, and the source/drain electrode includes forming the first semiconductor layer on the substrate, forming the second semiconductor layer on the first semiconductor layer, and forming the source/drain electrode on the second semiconductor layer.

In some embodiments, forming the first semiconductor layer and the second semiconductor layer includes using CVD.

In some embodiments, the polycrystalline semiconductor material includes polysilicon, and the amorphous semiconductor material includes amorphous silicon.

BRIEF DESCRIPTION OF THE DRAWINGS

To describe the technical solutions in the embodiments of the present disclosure more clearly, the accompanying drawings of the embodiments are briefly described below. It should be understood that the drawings described below refer only to some embodiments of the present disclosure, and not to restrict the present disclosure, wherein.

DETAILED DESCRIPTION

Figure 1:
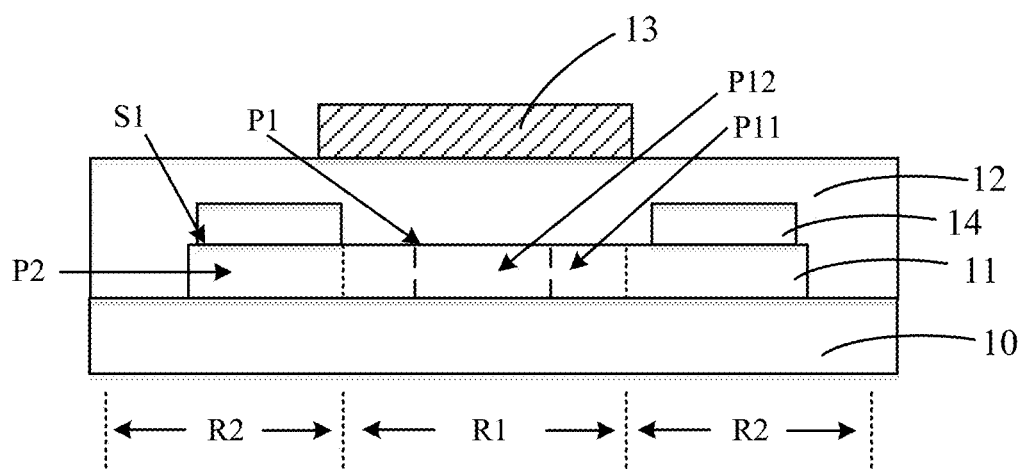
FIG. 1 is a schematic view of a thin film transistor according to an embodiment of the present disclosure.

In order to make the technical solutions and advantages of the embodiments of the present disclosure more comprehensible, the technical solutions of the embodiments of the present disclosure are clearly and completely described below with reference to the accompanying drawings. Obviously, the described embodiments are only a part but not all of the embodiments of the present disclosure. Based on the described embodiments of the present disclosure, all other embodiments obtained by those skilled in the art without creative efforts shall also fall within the protection scope of the present disclosure.

As used herein and in the appended claims, the singular form of a word includes the plural, and vice versa, unless the context clearly dictates otherwise. Thus, the references "a", "an", and "the" are generally inclusive of the plurals of the respective terms. Similarly, the words "comprise", "comprises", and "comprising" are to be interpreted inclusively rather than exclusively.

For purposes of the description, hereinafter, the terms "upper", "lower", "right", "left", "vertical", "horizontal", "top", "bottom", and derivatives thereof shall relate to the disclosure, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "contact" means that a first element, such as a first structure, and a second element, such as a second structure, are connected with or without any intermediary elements at the interface of the two elements.

FIG. 1 is a schematic view of a thin film transistor according to an embodiment of the present disclosure. As shown in FIG. 1, a thin film transistor according to an embodiment of the present disclosure includes a substrate 10, a first semiconductor layer 11, a gate dielectric layer 12, and a gate electrode 13 which are sequentially stacked on the substrate 10. The first semiconductor layer 11 has a first portion P1 located in a channel region R1 of the thin film transistor and a second portion P2 located in source/drain regions R2 of the thin film transistor and located on both sides of the first portion P1. The second portion P2 and a first sub-portion P11 of the first portion P1 adjacent to the second portion P2 include an amorphous semiconductor material. A second sub-portion P12 of the first portion P1 between the first sub-portions P11 includes a polycrystalline semiconductor material. The thin film transistor further includes a second semiconductor layer 14 located in the source/drain regions R2 and in contact with the second portion P2. The conductivity of the second semiconductor layer 14 is higher than a conductivity of the amorphous semiconductor material. For example, according to some embodiments of the present disclosure, the first semiconductor layer may be unintentionally doped, and the second semiconductor layer may be N-type or P-type doped. According to another embodiment of the present disclosure, the first semiconductor layer may have the same doping type as the second semiconductor layer but have a lower doping concentration.

For the thin film transistor according to an embodiment of the present disclosure, the second semiconductor layer 14 is not in direct contact with the first portion P1 of the first semiconductor layer 11, which can reduce the hot carrier effect and reduce the leakage current of the transistor.

As shown in FIG. 1, in an embodiment of the present disclosure, the second semiconductor layer 14 may be in contact with a surface 51 of the second portion P2 of the first semiconductor layer 11 remote from the substrate.

Figure 2:
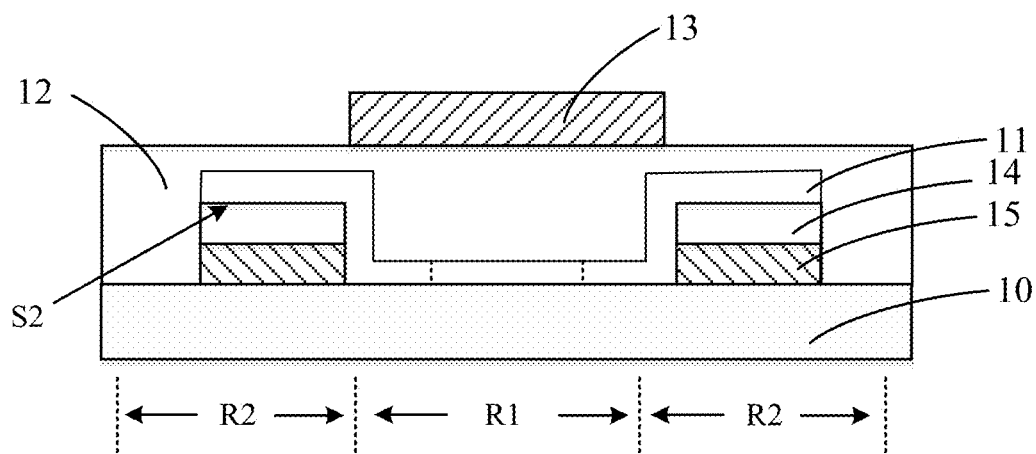
FIG. 2 is a schematic view of a thin film transistor according to an embodiment of the present disclosure.

FIG. 2 is a schematic view of a thin film transistor according to an embodiment of the present disclosure. As shown in FIG. 2, in an embodiment of the present disclosure, the second semiconductor layer 14 may be in contact with a surface S2, facing the substrate, of the second portion P2 of the first semiconductor layer 11.

The thin film transistor may further include a source/drain electrode 15 on a side, facing away from the second portion P2 of the first semiconductor layer 11, of the second semiconductor layer 14.

The doping type of the first semiconductor layer 11 and the second semiconductor layer 14 may be an N-type, and an N-type carrier concentration of the second semiconductor layer 14 is greater than the N-type carrier concentration of the first semiconductor layer 11. For example, the doping concentration of the first semiconductor layer 11 is between $10^{17}$ ions/cm$^3$ and $10^{19}$ ions/cm$^3$. For example, the doping concentration of the second semiconductor layer may be between $10^{19}$ ions/cm$^3$ and $10^{21}$ ions/cm$^3$. For example, when the material of the first and second semiconductor layers is a tetravalent element semiconductor material such as silicon, the N-type dopant may be a pentavalent impurity element such as phosphorus.

The doping type of the first semiconductor layer 11 and the second semiconductor layer 14 is a P-type, and a P-type carrier concentration of the second semiconductor layer 14 is greater than a P-type carrier concentration of the first semiconductor layer 11. For example, the doping concentration of the first semiconductor layer 11 may be between $10^{17}$ ions/cm$^3$ and $10^{19}$ ions/cm$^3$. For example, the doping concentration of the second semiconductor layer may be between $10^{19}$ ions/cm$^3$ and $10^{21}$ ions/cm$^3$. For example, when the material of the first and second semiconductor layers is a tetravalent element semiconductor material, such as silicon, the P-type dopant may be a trivalent impurity element, such as boron.

According to an embodiment of the present disclosure, the polycrystalline semiconductor material may include polysilicon, and the amorphous semiconductor material may include amorphous silicon.

Embodiments of the present disclosure also provide a method for manufacturing a thin film transistor. A method for manufacturing a thin film transistor according to an embodiment of the present disclosure includes forming a first semiconductor layer 11, a gate dielectric layer 12, and a gate electrode 13 sequentially on a substrate 10, wherein the first semiconductor layer 11 has a first portion P1 located in a channel region R1 of the thin film transistor and a second portion P2 located in source/drain regions R2 of the thin film transistor and on both sides of the first portion, and forming a second semiconductor layer 14 in the source/drain regions R2 and in contact with the second portions P2. The second portion P2 and first sub-portions P11 of the first portion P1 adjacent to the second portion P2 include an amorphous semiconductor material, and a second sub-portion P12 of the first portion P2 between the first sub-portions P2 includes a polycrystalline semiconductor material. A conductivity of the second semiconductor layer 14 is higher than a conductivity of the amorphous semiconductor material.

Figure 3A:
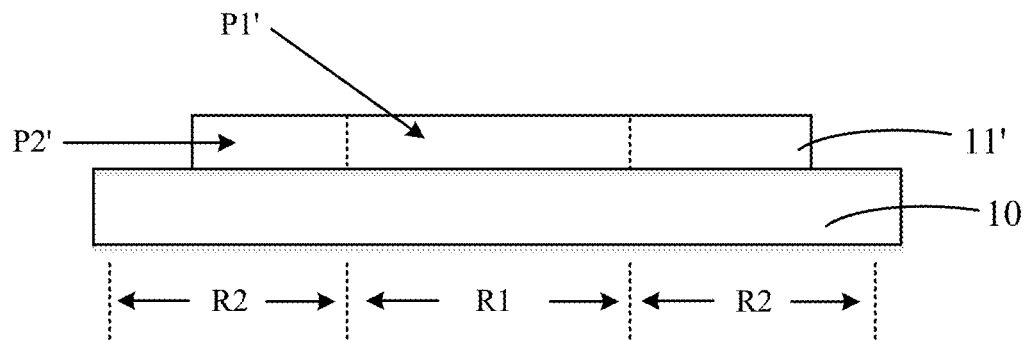
FIGS. 3A-3B are schematic views of a method for forming a first semiconductor layer according to an embodiment of the present disclosure.
Figure 3B:
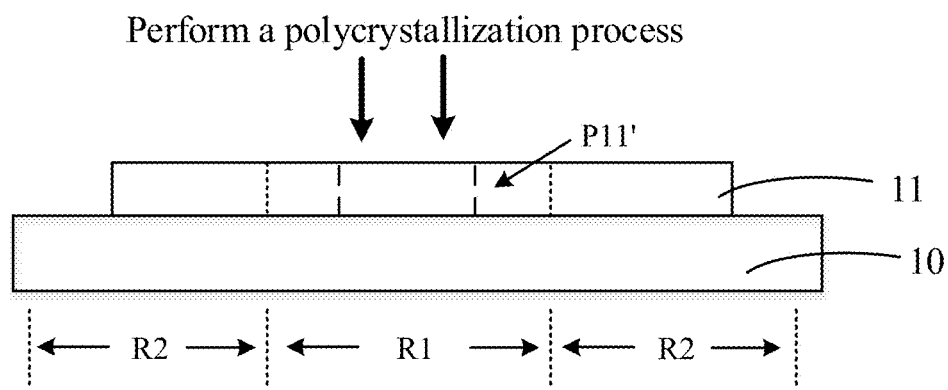

For the method for manufacturing a thin film transistor according to some embodiments of the present disclosure, the second semiconductor layer 14 is not in direct contact with the first portion P1 of the first semiconductor layer 11, which can reduce the hot carrier effect and reduce the leakage current of the transistor. FIGS. 3A-3B are schematic views of a method for forming a first semiconductor layer according to an embodiment of the present disclosure. As shown in FIGS. 3A-3B, forming the first semiconductor layer may include:

S31. As shown in FIG. 3A, forming a first semiconductor material layer 11' including the amorphous semiconductor material. The first semiconductor material layer 11' includes a middle portion P1' as the first portion P1 and edge portions P2', as the second portion P2, on both sides of the middle portion P1'.

S33. As shown in FIG. 3B, converting a portion P11', corresponding to the first sub-portion P11, of the middle portion P1' of the first semiconductor material layer 11' into a polycrystalline semiconductor material.

According to an embodiment of the present disclosure, laser annealing may be used to convert an amorphous semiconductor material into a polycrystalline semiconductor material (i.e., perform a polycrystallization process). For example, a Micro Lens Array (MLA) mask can be used for laser annealing.

Figure 4A:
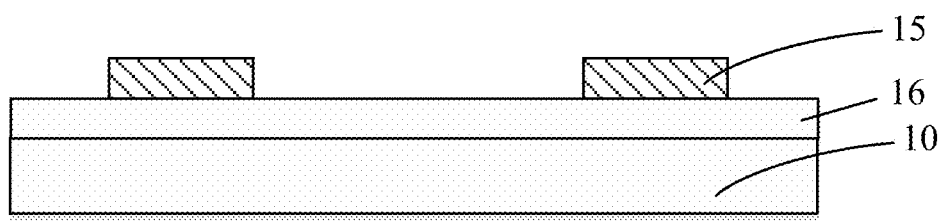
FIGS. 4A-4C are schematic views of a method for forming a first semiconductor layer, a second semiconductor layer, and source/drain electrode according to an embodiment of the present disclosure.
Figure 4B:
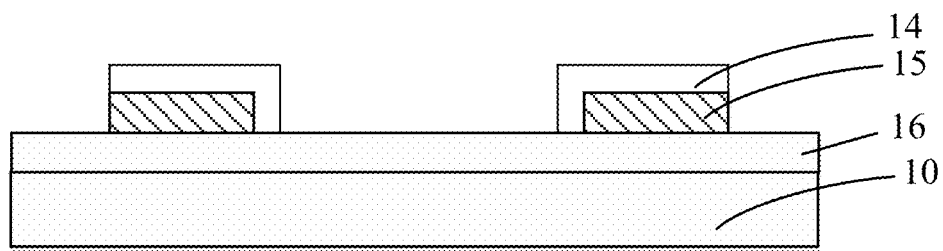
Figure 4C:
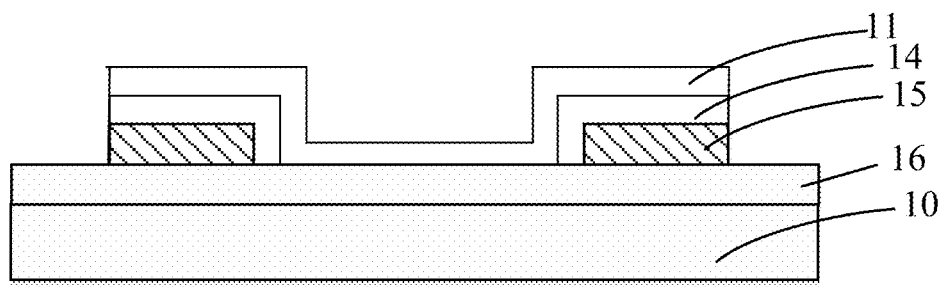

The method for manufacturing a thin film transistor according to an embodiment of the present disclosure further includes forming a source/drain electrode 15 on a side of the second semiconductor layer 14 facing away from the second portions P2. FIGS. 4A-4C are schematic views of a method for forming a first semiconductor layer, a second semiconductor layer, and a source/drain electrode according to an embodiment of the present disclosure. In the embodiment shown in FIGS. 4A-4C, forming the first semiconductor layer, the second semiconductor layer, and the source/drain electrode includes:

S41. As shown in FIG. 4A, forming source/drain electrode 15 on the substrate 10. For example, a conductive layer may be deposited on a substrate and then the conductive layer may be patterned to form the source/drain electrode. The source/drain electrode may include a metal, for example, molybdenum. A buffer layer 16 may be formed on the substrate before forming the source/drain electrode is formed.

S43. As shown in FIG. 4B, forming the second semiconductor layer 14 on the source/drain electrode 15. For example, an amorphous silicon material can be deposited on the source/drain electrode and be doped, and then the amorphous silicon material is patterned to remove a portion located in the channel region, thereby forming a second semiconductor layer. According to some embodiments of the present disclosure, the doping may be in-situ doping performed during the deposition, or may be doped separately after the deposition.

S45. As shown in FIG. 4C, forming the first semiconductor layer 11 on the second semiconductor layer 14. For example, an amorphous silicon material may be deposited on the second semiconductor layer 14 to form a first semiconductor layer.

Figure 5A:
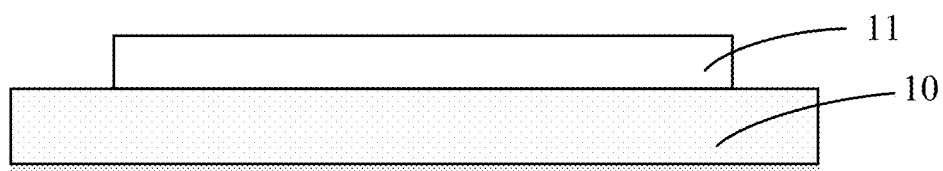
FIGS. 5A-5C are schematic views of a method for forming a first semiconductor layer, a second semiconductor layer, and source/drain electrode according to an embodiment of the present disclosure.
Figure 5B:
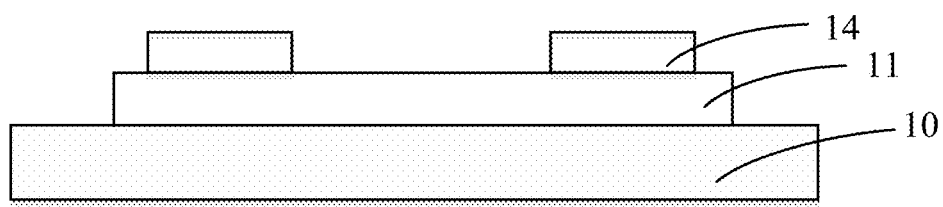
Figure 5C:
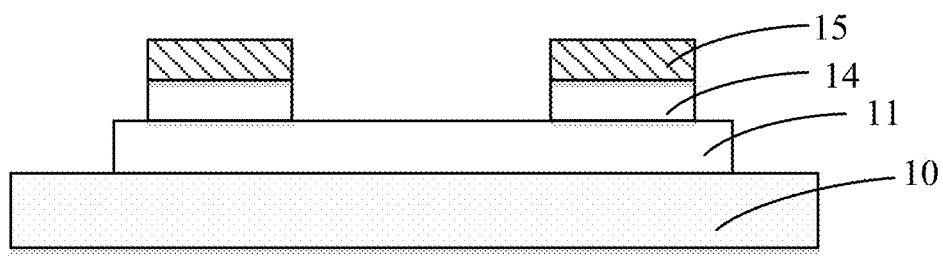

FIGS. 5A-5C are schematic views of a method for forming a first semiconductor layer, a second semiconductor layer, and a source/drain electrode according to an embodiment of the present disclosure. In the embodiment shown in FIGS. 5A-5C, forming the first semiconductor layer, the second semiconductor layer, and the source/drain electrode includes:

S51. As shown in FIG. 5A, forming the first semiconductor layer 11 on the substrate 10. For example, an amorphous silicon material may be deposited on a substrate to form a first semiconductor layer. A buffer layer may be formed on the substrate before the first semiconductor layer 11 is formed.

S53. As shown in FIG. 5B, forming the second semiconductor layer 14 on the first semiconductor layer 11. For example, an amorphous silicon material may be deposited on the first semiconductor layer and be doped, and then the amorphous silicon material is patterned to remove a portion located in the channel region, thereby forming a second semiconductor layer.

S55. As shown in FIG. 5C, forming the source/drain electrode 15 on the second semiconductor layer 14. For example, a conductive layer may be deposited on the second semiconductor layer, and then the conductive layer may be patterned to form the source/drain electrode.

According to some embodiments of the present disclosure, a method such as chemical vapor deposition (CVD) may be adopted to form a semiconductor layer.

The specific embodiments have been described, and are not intended to limit the scope of the disclosure. In fact, the novel embodiments described herein can be implemented in a variety of other forms. In addition, various omissions, substitutions, and changes in the form of the embodiments described herein may be made without departing from the spirit of the disclosure. The following claims and their equivalents are intended to cover such forms or modifications that fall within the scope and spirit of the disclosure.

What is claimed is:

1. A thin film transistor comprising:
    a substrate;
    a first semiconductor layer, a gate dielectric layer, and a gate electrode sequentially stacked on the substrate, wherein the first semiconductor layer has a first portion located in a channel region of the thin film transistor and a second portion located in source/drain regions of the thin film transistor and on both sides of the first portion, wherein the second portion and first sub-portion adjacent to the second portion of the first portion comprise an amorphous semiconductor material, and wherein a second sub-portion, between the first sub-portions, of the first portion comprises a polycrystalline semiconductor material;
    a second semiconductor layer located in the source/drain regions and in contact with the second portion, wherein a conductivity of the second semiconductor layer is higher than a conductivity of the amorphous semiconductor material, wherein the second semiconductor layer is in contact with a surface of the second portion facing the substrate; and
    a source/drain electrode, wherein a surface facing away from the substrate of the second semiconductor layer is in contact with a surface facing towards the substrate of the second portion, and wherein a surface facing towards the substrate of the second semiconductor layer is in contact with a surface facing away from the substrate of the source/drain electrode.

2. The thin film transistor according to claim 1, wherein a doping type of the first semiconductor layer and a doping type of the second semiconductor layer are an N-type, and wherein an N-type carrier concentration of the second semiconductor layer is greater than an N-type carrier concentration of the first semiconductor layer.

3. The thin film transistor according to claim 1, wherein a doping type of the first semiconductor layer and a doping type of the second semiconductor layer are a P-type, and wherein a P-type carrier concentration of the second semiconductor layer is greater than a P-type carrier concentration of the first semiconductor layer.

4. The thin film transistor according to claim 1, wherein a doping concentration of the first semiconductor layer is between $10^{17}$ ions/cm$^3$ and $10^{19}$ ions/cm$^3$, and wherein a doping concentration of the second semiconductor layer is between $10^{19}$ ions/cm$^3$ and $10^{21}$ ions/cm$^3$.

5. The thin film transistor according to claim 1, wherein the polycrystalline semiconductor material comprises polysilicon, and wherein the amorphous semiconductor material comprises amorphous silicon.

6. A method for manufacturing a thin film transistor, the method comprising:
    forming a first semiconductor layer, a gate dielectric layer, and a gate electrode sequentially on a substrate, wherein the first semiconductor layer has a first portion located in a channel region of the thin film transistor and a second portion located in a source/drain region of the thin film transistor and on both sides of the first portion, wherein the second portion and first sub-portions, adjacent to the second portion, of the first portion comprise an amorphous semiconductor material, and wherein a second sub-portion, between the first sub-portions, of the first portion comprises a polycrystalline semiconductor material;
    forming a second semiconductor layer in the source/drain regions and in contact with the second portion, wherein a conductivity of the second semiconductor layer is higher than a conductivity of the amorphous semiconductor material, wherein the second semiconductor layer is in contact with a surface of the second portion facing the substrate; and
    forming a source/drain electrode, wherein a surface facing away from the substrate of the second semiconductor layer is in contact with a surface facing towards the substrate of the second portion, and wherein a surface facing towards the substrate of the second semiconductor layer is in contact with a surface facing away from the substrate of the source/drain electrode.

7. The method for manufacturing a thin film transistor according to claim 6, wherein forming the first semiconductor layer comprises:
    forming a first semiconductor material layer comprising the amorphous semiconductor material, the first semiconductor material layer comprising a middle portion as the first portion and edge portions as the second portion, the edge portions being on both sides of the middle portion; and
    converting a portion, corresponding to the second sub-portion, of the middle portion of the first semiconductor material layer into the polycrystalline semiconductor material.

8. The method for manufacturing a thin film transistor according to claim 7, wherein the converting comprises laser annealing the amorphous semiconductor material.

9. The method for manufacturing a thin film transistor according to claim 8, wherein the laser annealing comprises using a micro lens array mask.

10. The method for manufacturing a thin film transistor according to claim 6, wherein forming the first semiconductor layer, the second semiconductor layer, and the source/drain electrode comprises:
    forming the source/drain electrode on the substrate;
    forming the second semiconductor layer on the source/drain electrode; and
    forming the first semiconductor layer on the second semiconductor layer.

11. The method for manufacturing a thin film transistor according to claim 10, wherein forming the first semiconductor layer and the second semiconductor layer comprises using CVD.

12. The method for manufacturing a thin film transistor according to claim 6, wherein the polycrystalline semiconductor material comprises polysilicon, and wherein the amorphous semiconductor material comprises amorphous silicon.

* * * * *